United States Patent [19]
Ek et al.

[11] Patent Number: 5,563,428
[45] Date of Patent: Oct. 8, 1996

[54] LAYERED STRUCTURE OF A SUBSTRATE, A DIELECTRIC LAYER AND A SINGLE CRYSTAL LAYER

[76] Inventors: Bruce A. Ek, 15 Shore Rd., Pelham Manor, N.Y. 10803; Stephen M. Gates, 22 Inningwood Rd., Ossining, N.Y. 10562; Fernando J. Guarin, R.R. 2, Box 218, Millbrook, N.Y. 12545; Subramanian S. Iyer, 3172 Cedar Rd., Yorktown Heights, N.Y. 10598; Adrian R. Powell, 45 S. Lake Shore Dr., Brookfield, Conn. 06804

[21] Appl. No.: 380,782

[22] Filed: Jan. 30, 1995

[51] Int. Cl.$^6$ ............... H01L 31/0312; H01L 27/108; H01L 33/00; H01L 31/0328
[52] U.S. Cl. ............... 257/77; 257/70; 257/78; 257/103; 257/201
[58] Field of Search ............... 257/65, 70, 75, 257/76, 77, 103, 201; 272/44, 45

[56] References Cited

U.S. PATENT DOCUMENTS

| | | | |
|---|---|---|---|
| 4,816,421 | 3/1989 | Dynes et al. | 437/26 |
| 4,855,254 | 8/1989 | Eshita et al. | 437/100 |
| 4,983,538 | 1/1991 | Gotou | 437/100 |
| 4,997,787 | 3/1991 | Eshita | 437/62 |
| 5,194,395 | 3/1993 | Wada | 437/10 |
| 5,225,032 | 7/1993 | Golecki | 156/612 |
| 5,229,333 | 7/1993 | Cho et al. | 437/235 |
| 5,230,768 | 7/1993 | Furukawa et al. | 156/612 |
| 5,239,188 | 8/1993 | Takeuchi et al. | 257/76 |
| 5,250,147 | 10/1993 | Mantl et al. | 156/603 |
| 5,272,104 | 12/1993 | Schrantz et al. | 437/63 |
| 5,389,799 | 2/1995 | Uemoto | 257/77 |
| 5,432,808 | 7/1995 | Hatano et al. | 257/77 |

FOREIGN PATENT DOCUMENTS 5-48145  2/1993  Japan ............... 257/77

OTHER PUBLICATIONS

Steckl et al., SiC Silcon–on–Insulator Structures by Direct Carbonization Conversion and Postgrowth from Silacyclobutane, J. Electrochem. Soc., vol. 141, No. 6 (1994), pp. L66–L68.
Abstract RD–173053, 1994.

*Primary Examiner*—Mahshid Saadat
*Attorney, Agent, or Firm*—Pollock, Vande Sande & Priddy

[57] ABSTRACT

A structure is fabricated comprising a substrate, a dielectric layer formed over the substrate, and a single crystal layer of a compound formed over the dielectric layer. The single crystal layer is formed by the chemical reaction of at least a first element with an initial single crystal layer of a second element on the dielectric layer having an initial thickness of about 100 to about 10,000 angstroms.

According to another aspect, a carbide single crystal layer is provided on a substrate by depositing carbon from a solid carbon source at a low rate and low temperature, followed by reacting the carbon with the underlying layer to convert it to the carbide.

13 Claims, 2 Drawing Sheets

LAYERED STRUCTURE OF A SUBSTRATE, A DIELECTRIC LAYER AND A SINGLE CRYSTAL LAYER

STATEMENT AS TO RIGHTS MADE UNDER FEDERALLY-SPONSORED RESEARCH AND DEVELOPMENT

The present invention was made under contract N 00014-91-C-0080 granted by the Department of the Navy. The Government has certain rights in the present invention.

DESCRIPTION

1. Technical Field

The present invention is concerned with a layered semiconductive structure. In particular, the present invention is concerned with a layered semiconductive structure comprising a substrate, and a single crystal semiconductor layer. The present invention makes it possible to provide single crystal semiconductor layers on relatively large diameter substrates.

The present invention is also directed to the use of the layered semiconductive structures. In particular, the present invention is concerned with the use of the structures as a template for the growth of additional crystalline layers. In this way, the present invention makes it possible to integrate optical interconnect devices with semiconductor based logic.

2. Background of the Invention

Silicon carbide is a wide bandgap semiconductor that has great potential for many electronic applications. A key barrier to its widespread use is the inability to grow large diameter high quality substrates economically and of sufficient quality for electronic devices. There have been many attempts to grow silicon carbide on silicon to obviate these problems. However, the large lattice mismatch (25%) precludes the growth of good quality silicon carbide. The polytypism exhibited further complicates matters.

One method that is widely used to grow silicon carbide on silicon is to deposit a thin layer of carbon on silicon. The carbon is deposited either through heterogeneous gas phase nucleation or direct carbon deposition and then reacting this carbon to form a silicon carbon layer. The literature refers to this process as carbonization or carburization. This carbide layer acts as a seed for subsequent silicon carbide growth. The main problem with this method lies in the fact that the carbide template layer formed is highly defective.

Any defects in this initial layer will have a severe impact on the defect density of layers grown upon this carbonization layer as it is the seed for subsequent silicon carbide growth. The carbide template layer formed is highly defective, not only because of the lattice mismatch, but also due to the elevated temperatures that are required for the cracking of the various reacting gases (primarily hydrocarbons). The elevated temperatures increase the diffusion of silicon across the newly formed silicon carbide layers and lead to the formation of voids in this critical carbonization layer.

Moreover, at the present time, optical communications and silicon based logic are distinct technologies employing separate processing methods. A major problem in the development of direct bandgap semiconductors, for example, gallium nitride, as commercially viable materials for device applications is the lack of an adequate substrate.

Furthermore, currently, high temperature FET's based on silicon carbide are fabricated using very expensive silicon carbide one inch or two inch diameter substrates.

SUMMARY OF INVENTION

The present invention overcomes prior art problems discussed above. In particular, the present invention makes it possible to use the state of the art large diameter (e.g.—up to 8 inch diameter) silicon processing tools allowing for the use of economic processing techniques. The single crystal layer, such as the silicon carbide, formed in the present invention is significantly less costly than that formed by other techniques.

In addition, the present invention makes it possible to integrate optical materials directly onto, for instance, silicon wafers. The layered substrates of the present invention are compatible with existing silicon processing. The present invention provides a very versatile tool for the heteroepitaxial growth of a variety of systems.

The present invention is concerned with a layered structure that comprises a substrate, a dielectric layer formed over said substrate, and a single crystal layer formed over the dielectric layer. The single crystal layer has a thickness of about 200 to about 20,000 angstroms and is formed by the chemical reaction of at least a first element with an initial single crystal layer of a second element on the dielectric layer. It is important to the success of the present invention that the second element have an initial thickness of about 100 to about 10,000 angstroms.

The present invention is also concerned with a method for forming a single crystalline layer of a compound on a first substrate. The method comprises bonding a major surface of a second single crystalline substrate of a first element to a major surface of the first substrate, wherein the second substrate has a thickness of about 100 to about 10,000 angstroms. A second element is chemically reacted with the first element of the second substrate to form the single crystalline layer of the compound.

Another aspect of the present invention comprises providing a carbide single crystal layer on a substrate by depositing carbon from a solid carbon source at a low rate of about 0.01 to about 0.02 angstroms/second, and low temperature of about 800 to about 1,300 K. The structure is then heated to a temperature of about 1,200 to about 1,300 K to convert the carbon layer to a carbide by chemical reaction with the underlying substrate.

The present invention is also concerned with the layered substrate obtained by the above process.

According to a still further aspect of the present invention, the structures formed as discussed above further containing electrical conductivity.

In particular, the present invention comprise a semiconductor layer over the single crystal layer.

BEST AND VARIOUS MODES FOR CARRYING OUT INVENTION

Figure 1:
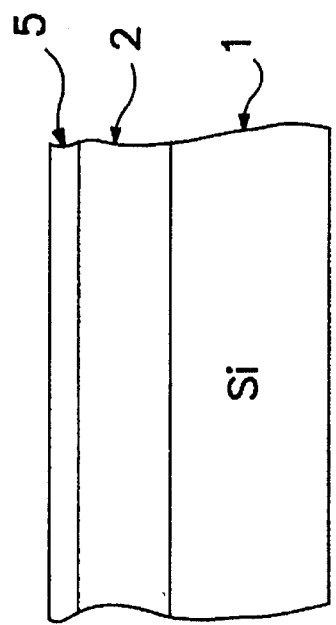
FIG. 1 illustrates a reaction for forming a structure of the present invention.
Figure 1:
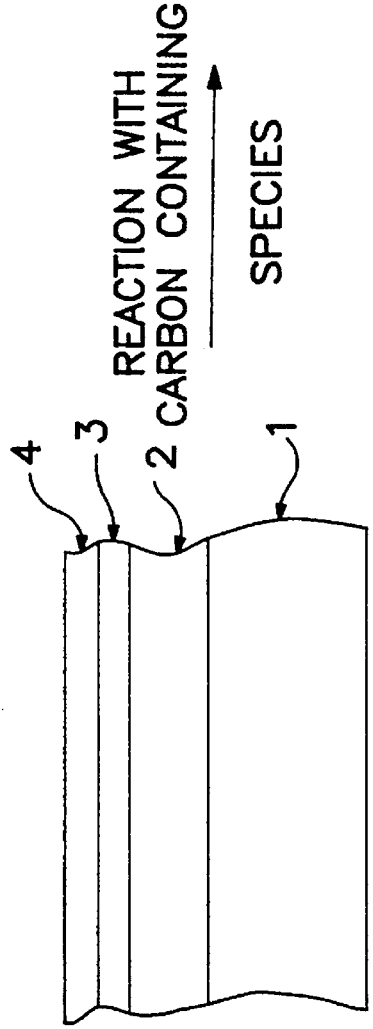

FIG. 1 is a schematic representation of forming a structure of the present invention. In particular, a substrate 1, such as silicon, is provided, over which is provided a dielectric layer 2. Examples of suitable dielectric layer 2 are glasses such as silicon dioxide, silicon oxynitrides and borosilicates. The dielectric layer is typically about 1000 to about 20,000 angstroms thick, preferably about 1,000 to about 5,000 angstroms thick, and most preferably about 2,000 angstroms thick.

The dielectric layer can be provided by any known technique, such as CVD (chemical vapor deposition) and in the case of silicon oxide or silicon dioxide by thermal oxidation of the silicon substrate.

A relatively thin layer 3 of a crystalline material is formed over the dielectric layer 2. This layer 3 has a thickness of about 100 to about 10,000 angstroms, preferably about 200 to about 1,000 angstroms, and most preferably about 200 to about 300 angstroms. It is critical to the success of this invention that the layer 3 be relatively thin and be crystalline. The layer is preferably silicon. This layer 3 can be formed by any conventional technique, such as by the bond and etch back technique (BESOI) or by Simox, or by lateral epitaxial overgrowth.

This layer 3 is then converted to a single crystal layer of a compound by chemical reaction with a second and different element.

FIG. 1 illustrates depositing as the second element 4 carbon. Other elements are germanium, cobalt, titanium and tantalum. The carbon can be deposited from a solid carbon source or less preferably by heterogeneous gas phase nucleation.

The thickness of layer 4 is kept equal or at least substantially equal ±10% to the layer 3 thickness, which is thin enough to form a homogeneous single crystal layer without the nucleation of defects.

The layer 3/layer 4 bilayer (e.g. C/Si) is then reacted at temperatures typically about 900–1,770 K, and preferably 1,070–1,170 K to form a uniform single crystal layer 5. The rate of reaction is directly related to the temperature and it is preferred to maintain the temperature as low as possible (e.g. —1,070 K) for control of the quality of layer 5. In the case of silicon and carbon, such layer is silicon carbide, which is usually 3c-SiC. This layer 5 can then be used as a template for further deposition of silicon carbide or some other semiconductor.

Figure 2:
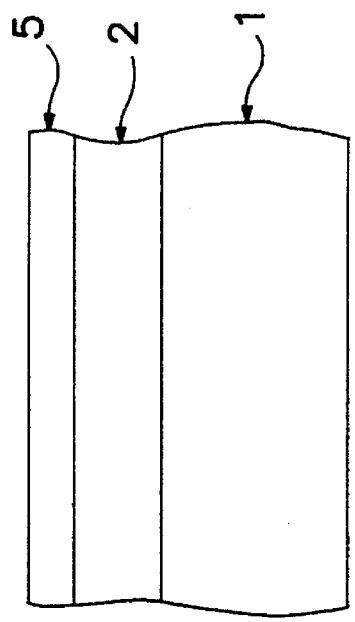
FIG. 2 illustrates an alternative reaction for forming a structure of the present invention.
Figure 2:
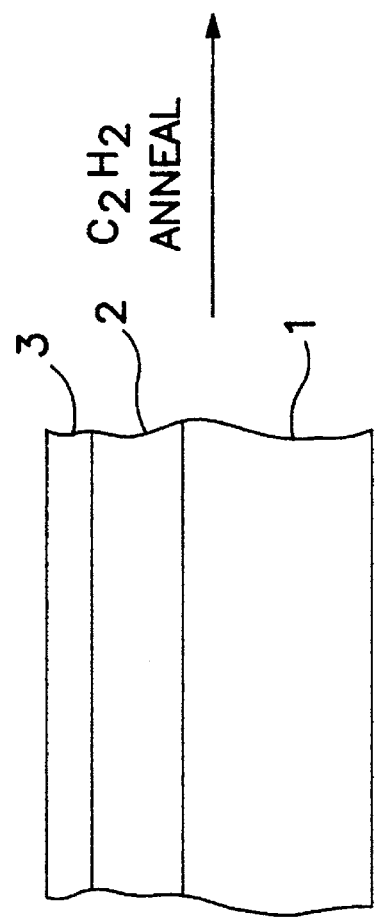

FIG. 2 illustrates an alternative route to obtaining the structures of the present invention. In particular, the thin layer 3 is reacted with, for example, a carbon containing gas, such as acetylene, $C_2H_2$. The reaction is carried out at temperatures that are high enough to effect carbonization of the thin layer 3. These temperatures are typically at least about 1,200–1,600 K.

The layer 4, such as the silicon carbide formed pursuant to the present invention can be used for a wide variety of purposes, in a variety of fields, such as high temperature electronics, microwave devices, automotive electronics, high power devices, optoelectronics and radiation hard electronics. In addition, the present invention makes it possible to use state of the art large diameter, such as 8 inch diameter, silicon processing tools. Therefore, economic processing techniques can be used.

Since layer 3 is relatively thin and entirely consumed in the process, a single crystal layer on an amphorous substrate is provided. The strain that may result from the volume change is accommodated by slippage at the interface of the single crystal layer and dielectric.

According to a further aspect of the present invention, a carbide single crystal layer is provided on a substrate. The process comprises depositing carbon from a solid carbon source at a relatively low rate of about 0.01 to about 0.02 angstroms/second, and preferably about 0.015 angstroms/second, and at a relatively low temperature of about 800 to about 1,300 K, and preferably about 1,200 to about 1,300 K. The rate of deposition and temperature are selected to deposit a uniform layer of carbon over the entire surface.

The structure is then heated to a temperature of about 1,000 to about 1,300 K, and preferably about 1,200 to about 1,250 K to convert it to the carbide. This temperature is selected such that the diffusion of the underlying material, such as silicon, is properly matched with the deposition rate of carbon from the solid source, and should be as low as possible. This allows for greater control over the carbide reaction, thus reducing the void formation and greatly improving the quality of the grown carbide carbonization layer. As the carbide layer is formed, the silicon diffusion rate decreases across the silicon carbide layer, and uniform growth can be maintained by either increasing the temperature for the growth and/or by lowering the carbon flux.

In a typical example, onto a five inch (100) silicon on insulator (SOI) substrate is deposited a buffer Si layer of about 10 to about 100 angstroms thick, at a temperature of about 923 K. The wafer is then cooled down to a temperature of about 473 K and a thin layer of carbon is uniformly deposited over the entire wafer. This carbon layer is converted into a SiC layer by increasing the substrate temperature to about 950 K. The carbon is obtained from a solid source, implemented with an elemental graphite filament which was heated above sublimation temperature, i.e., about 3,000 K. The carbon source temperature and consequently its flux are controlled by limiting the current through the graphite filament to a rate <0.01 A/sec. The wafer is heated at a controlled rate while exposed to the carbon flux to a temperature in the 950 to 1223 K range. It is then annealed at this temperature for about 10 to about 30 minutes, and gradually cooled down to room temperature at a rate of about 10–30 K/min.

In a still further aspect of the present invention, the layered structures obtained by the methods described above are used as templates for a semiconductor layer, such as additional silicon carbide, silicon germanium, silicon germanium carbide and gallium nitride. Of particular interest are structures that integrate light emitting and detecting structures based on direct bandgap semiconductors with silicon based logic.

Figure 3:
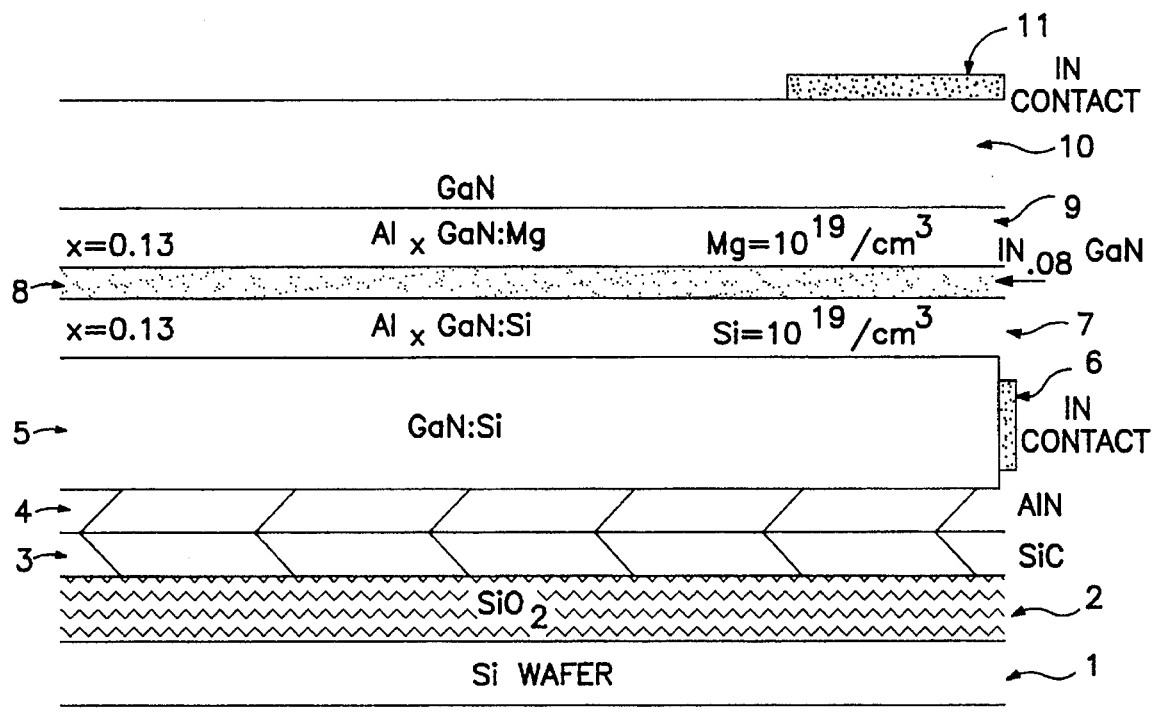
FIG. 3 illustrates a blue LED structure on a layered structure of the present invention.

For instance, a direct band gap semiconductor is lattice matched to the single crystal layer, such as the C-SiC and is grown thereon. FIG. 3 is a schematic diagram of a GaN based light emitting diode, using a C-AlN buffer layer to match the C-SiC. In FIG. 3, numeral 1 represents the substrate, such as silicon or sapphire, numeral 2, the dielectric layer and numeral 3 the single crystal layer, such as C-SiC prepared as discussed above.

A lattice matching layer 4, such as AlN is grown on the SiC layer 3. AlN is matched to SiC in both lattice constant and in coefficient of thermal expansion. This layer 4 is generally about 100 to about 2,000 angstroms, a typical example being about 500 angstroms. The layer 4 can be grown at temperatures of about 800 to about 1,300 K, typical of which being about 1,000 K, using OMCVD (organometallic chemical vapor deposition) with triethyl aluminum at a flow rate of about 10–100 micromole/min. and $NH_3$ at a flow rate of about 1–2 standard L./min. at a total pressure of about 100 torr. Next, semiconductor layer 5 is grown on top of layer 4. A typical example of layer 5 is GaN. This layer 5 is generally about 500 to about 10,000 angstroms thick, typical of which being about 5,000 angstroms.

Layer 5 can be grown, for instance, at about 973 K at a rate of 600 A/hr. using an EPI GEN II MBE (molecular beam epitaxy) system equipped with a Ga Knudsen Cell and a 70 Watt ECR source run at a magnetic current of 17 Amps to activate and dissociate nitrogen molecules. Alternatively, layer 5 can be grown by OMCVD at a temperature of 1,300 K using triethyl gallium at a flow rate of about 10–100 micromole/min. and $NH_3$ at a flow rate of about 1–2 standard L./min. at a total pressure of about 100 torr.

Layer 5 thus formed can be used for a wide variety of purposes in producing various devices such as Blue and UV LED's, photo detectors, visible lasers, small LED arrays for displays, and other optoelectronic devices.

In FIG. 3, a blue light emitting diode structure is provided, which includes doping layer 5 with silicon typically at a concentration of about $10^{19}/cm^3$. An input indium contact 6 is connected to layer 5. Next, a layer 7 about 200 to about 10,000 angstroms thick of aluminum gallium nitride, such as $Al_{0.13}$ GaN and being doped with silicon at a concentration of about $10^{18}/cm^3$ to about $10^{20}/cm^3$, typical of which being about $10^{19}/cm^3$ is deposited over layer 5. A layer 8 of $In_{0.8}$ GaN about 200 to about 2,000 angstroms thick is deposited over layer 7.

A second layer 9 of $Al_{0.13}$ GaN about 200 to about 10,000 angstroms thick is deposited on layer 8. Layer 9 is doped with a dopant of conductivity type opposite from the silicon dopant of layer 7. A typical dopant being magnesium at a dosage of about $10^{18}/cm^3$ to about $10^{20}/cm^3$, typical of which is about $10^{19}/cm^3$.

A second layer 10 of gallium nitride of about 500 to about 10,000 angstroms thick is deposited on layer 9.

Next, an Indium electrical contact 11 is provided on layer 10. Myers 7, 8, 9 and 10 contacts 6 and 11 and the doping can be provided by techniques well known to those skilled in the art.

Figure 4:
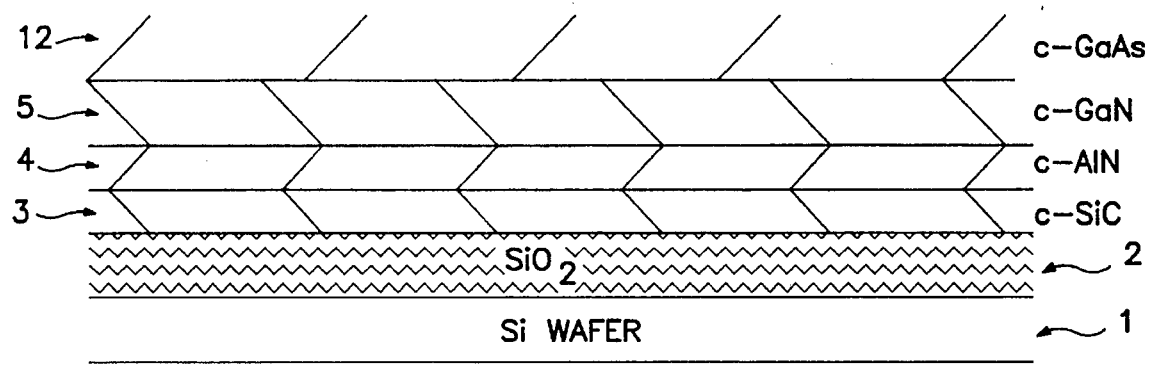
FIG. 4 illustrates a layered structure of the present invention suitable for fabricating an IR LED structure.

FIG. 4 is a schematic illustration of the integration with an underlying silicon substrate of direct band gap emitters spanning the spectral range from IR to near UV for optical fiber communication.

In particular, layer 12 of c-gallium arsenide of about 200 to about 20,000 angstroms thick is provided on c-gallium nitride layer 5.

What is claimed is:

1. A layered structure comprising:
    a substrate,
    a dielectric layer formed over said substrate,
    a single crystal layer of a compound formed over said dielectric layer, wherein said single crystal layer has a thickness of about 200 to about 20,000 angstroms,
    said single crystal layer formed by the chemical reaction of at least a first element with an initial single crystal layer of a second element on said dielectric layer having an initial thickness of about 100 to about 10,000 angstroms to form said single crystal layer of a compound.

2. The layered structure of claim 1 wherein said dielectric layer is selected from the group consisting of silicon dioxide, silicon oxynitride and borosilicate.

3. The layered structure of claim 1 wherein said first element is selected from the group consisting of carbon, germanium, cobalt, titanium and tungsten.

4. The layered structure of claim 1 wherein said second element is silicon.

5. The layered structure of claim 1 wherein said compound is silicon carbide.

6. The layered structure of claim 1 which further comprises a semiconductor layer located over said single crystal layer.

7. The layered structure of claim 6 wherein said semiconductor is lattice matched to said compound and is selected from the group consisting of SiC, SiGe, SiGeC, AlN and GaN.

8. The layered structure of claim 1 wherein said semiconductor is GaN and which further comprises a C-AlN layer located intermediate said semiconductor layer and said single crystal layer.

9. The layered structure of claim 1 wherein said substrate is at least a four inch diameter substrate.

10. The layered structure of claim 1 wherein said single crystal layer is about 200 to about 1,000 angstroms thick.

11. The layered structure of claim 1 wherein said single crystal layer is about 200 to about 300 angstroms thick.

12. The layered structure of claim 1 wherein said dielectric layer is about 1,000 to about 20,000 angstroms thick.

13. The layered structure of claim 1 wherein said dielectric layer is about 1,000 to about 5,000 angstroms thick.

* * * * *

UNITED STATES PATENT AND TRADEMARK OFFICE
CERTIFICATE OF CORRECTION

PATENT NO. : 5,563,428
DATED : October 8, 1996
INVENTOR(S) : Zek et al

It is certified that error appears in the above-indentified patent and that said Letters Patent is hereby corrected as shown below:

On the title page, insert the following information:

[73] Assignee: International Business Machines Corporation, Armonk, NY

Signed and Sealed this

Second Day of September, 1997

Attest:

BRUCE LEHMAN

Attesting Officer      Commissioner of Patents and Trademarks